(12) United States Patent
Cheng et al.

(10) Patent No.: US 10,084,081 B2
(45) Date of Patent: Sep. 25, 2018

(54) VERTICAL TRANSISTOR WITH ENHANCED DRIVE CURRENT

(71) Applicant: International Business Machines Corporation, Armonk, NY (US)

(72) Inventors: Kangguo Cheng, Schenectady, NY (US); Xin Miao, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/412,654

(22) Filed: Jan. 23, 2017

(65) Prior Publication Data
US 2018/0212054 A1    Jul. 26, 2018

(51) Int. Cl.
| H01L 29/775 | (2006.01) |
| H01L 29/06 | (2006.01) |
| H01L 29/78 | (2006.01) |
| H01L 29/08 | (2006.01) |
| H01L 29/423 | (2006.01) |
| H01L 21/225 | (2006.01) |
| H01L 29/10 | (2006.01) |

(52) U.S. Cl.
CPC ........ H01L 29/7827 (2013.01); H01L 21/225 (2013.01); H01L 29/0653 (2013.01); H01L 29/0847 (2013.01); H01L 29/1033 (2013.01); H01L 29/4238 (2013.01); H01L 29/42376 (2013.01); H01L 29/7831 (2013.01)

(58) Field of Classification Search
CPC ............. H01L 29/7827; H01L 29/0653; H01L 29/0847; H01L 29/1033; H01L 29/42376; H01L 29/4238; H01L 29/7831; H01L 21/225

USPC .................................... 257/329, 24, E29.245
See application file for complete search history.

(56) References Cited

U.S. PATENT DOCUMENTS

| 5,612,563 | A | * | 3/1997 | Fitch ................. H01L 21/76897 |
| | | | | 257/329 |
| 7,368,788 | B2 | | 5/2008 | Huo et al. |
| 7,838,913 | B2 | | 11/2010 | Cheng et al. |
| 8,679,903 | B2 | | 3/2014 | Blanchard |
| 9,252,145 | B2 | | 2/2016 | Basker et al. |

(Continued)

FOREIGN PATENT DOCUMENTS

KR    10-0660891 B1    12/2006

*Primary Examiner* — Cuong Q Nguyen
*Assistant Examiner* — Tong-Ho Kim
(74) *Attorney, Agent, or Firm* — Scully, Scott, Murphy & Presser, P.C.; Daniel P. Morris, Esq.

(57) ABSTRACT

A stacked vertical field effect transistor that has enhanced drive current is provided. The stacked vertical field effect transistor includes a lower functional gate structure located adjacent sidewall surfaces of a lower channel portion of a semiconductor channel material pillar. An upper functional gate structure is located above the lower functional gate structure and adjacent sidewall surfaces of an upper channel portion of the semiconductor channel material pillar. A bottom source/drain region is located beneath the lower functional gate structure, a middle source/drain region is located between the lower functional gate structure and the upper functional gate structure, and a top source/drain region is located above the upper functional gate structure.

11 Claims, 4 Drawing Sheets

(56) References Cited

U.S. PATENT DOCUMENTS

| | | | |
|---|---|---|---|
| 2011/0108803 A1* | 5/2011 | Deligianni | B82Y 10/00 257/24 |
| 2013/0043544 A1 | 2/2013 | Erickson et al. | |
| 2013/0240847 A1 | 9/2013 | Zakhidov et al. | |
| 2016/0099329 A1 | 4/2016 | Basu et al. | |
| 2016/0155941 A1 | 6/2016 | May et al. | |
| 2016/0204251 A1* | 7/2016 | Masuoka | H01L 21/823814 257/329 |

* cited by examiner

VERTICAL TRANSISTOR WITH ENHANCED DRIVE CURRENT

BACKGROUND

The present application relates to a semiconductor structure and a method of forming the same. More particularly, the present application relates to a stacked vertical field effect transistor that has enhanced drive current and a method of forming such a stacked vertical field effect transistor.

Conventional vertical transistors are devices where the source-drain current flows in a direction normal to the substrate surface. In such devices, a vertical semiconductor pillar (or fin) defines the channel with the source and drain located at opposing ends of the semiconductor pillar.

Vertical transistors are an attractive option for technology scaling. One potential drawback with conventional vertical transistors is that drive current for a given chip area is limited. As such, there is a need for providing a vertical transistor in which the drive current is enhanced for a given chip area.

SUMMARY

The present application provides a semiconductor structure including a stacked vertical field effect transistor that has enhanced drive current and a method of forming such a stacked vertical field effect transistor.

In one aspect of the present application, a semiconductor structure is provided. In one embodiment, the semiconductor structure includes a lower functional gate structure located adjacent sidewall surfaces of a lower channel portion of a semiconductor channel material pillar. An upper functional gate structure is located above the lower functional gate structure and adjacent sidewall surfaces of an upper channel portion of the semiconductor channel material pillar. A bottom source/drain region is located beneath the lower functional gate structure, a middle source/drain region is located between the lower functional gate structure and the upper functional gate structure, and a top source/drain region is located above the upper functional gate structure.

In another aspect of the present application, a method of forming a semiconductor structure is provided. In one embodiment, the method includes forming a material stack adjacent sidewall surfaces of a semiconductor channel material pillar. The material stack includes, from bottom to top, a bottom source/drain layer, a bottom spacer layer, a first sacrificial gate structure, a first middle spacer layer, a sacrificial spacer layer, a second middle spacer layer, a second sacrificial gate structure and a top spacer layer. Next, the sacrificial spacer layer located between the first and second middle spacer layers is removed to physically expose sidewall surfaces of a middle portion of the semiconductor channel material pillar. A first epitaxial doped semiconductor material layer is epitaxially grown from exposed sidewall surfaces of the middle portion of the semiconductor channel material pillar, and a second epitaxial doped semiconductor material layer is also epitaxially grown from exposed sidewall surfaces of an upper portion of the semiconductor channel material pillar. An anneal is then performed to diffuse dopants from the bottom source/drain layer into a bottom portion of the semiconductor channel material pillar and to provide a bottom source/drain region, dopants from the first epitaxial doped semiconductor material layer into the middle portion of the semiconductor channel material pillar and to provide a middle source/drain region, and dopants from the second epitaxial doped semiconductor material layer into the upper portion of the semiconductor channel material and to provide a top source/drain region. Next, the first sacrificial gate structure is replaced with a lower functional gate structure, and the second sacrificial gate structure is replaced with an upper functional gate structure.

DETAILED DESCRIPTION

Figure 2:
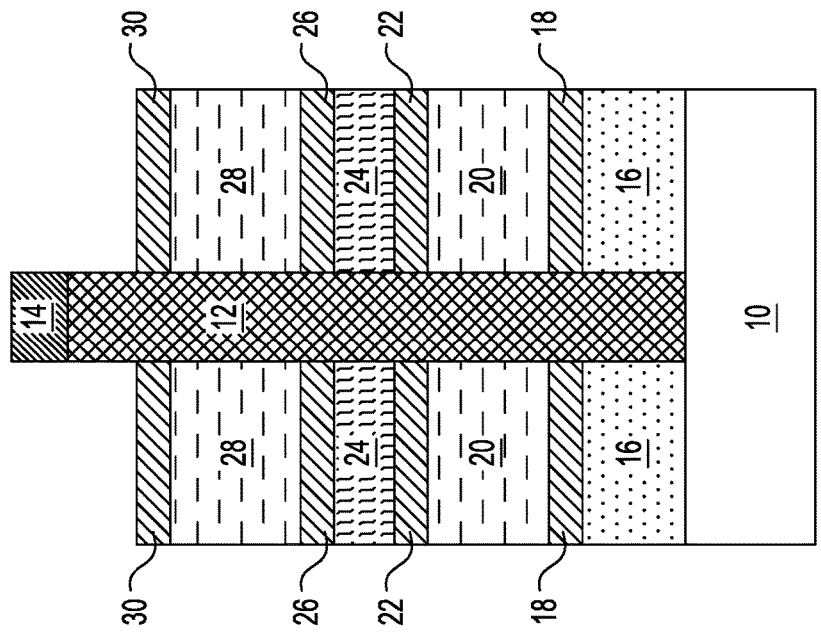
FIG. 2 is a cross sectional view of the exemplary semiconductor structure of FIG. 1 after forming a second material stack adjacent the sidewall surfaces of the semiconductor channel material pillar and on the first material stack, the second material stack including a sacrificial spacer layer, a second middle spacer layer, a second sacrificial gate structure and a top spacer layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
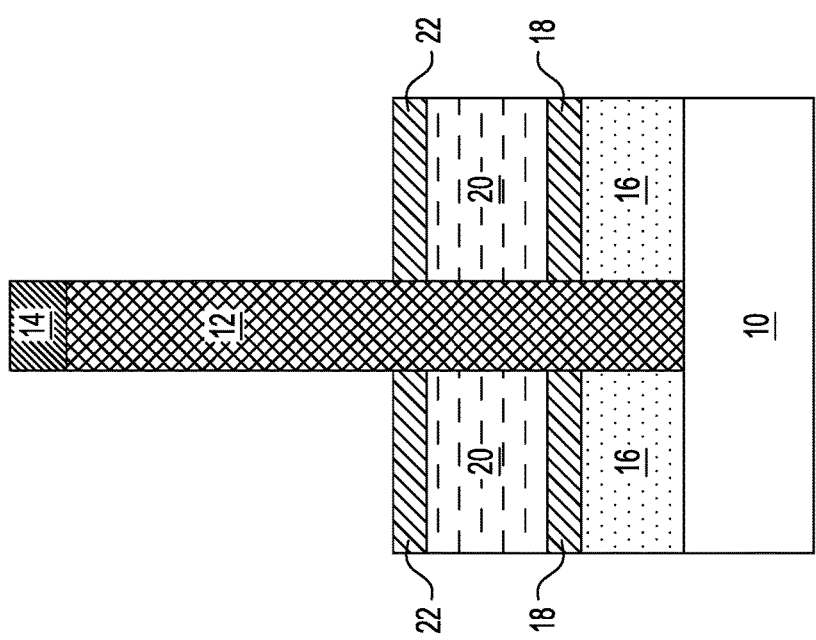
FIG. 1 is a cross sectional view of an exemplary semiconductor structure including a semiconductor channel material pillar extending upward from a semiconductor material surface of a semiconductor substrate, and including a first material stack located adjacent sidewall surfaces of the semiconductor channel material pillar, the first material stack includes a bottom source/drain layer, a bottom spacer layer, a first sacrificial gate structure and a first middle spacer layer.

Referring first to FIG. 1, there is illustrated an exemplary semiconductor structure that can be employed in accordance with an embodiment of the present application. The semiconductor structure of FIG. 1 includes a semiconductor channel material pillar (or fin) 12 extending upward from a semiconductor material surface of a semiconductor substrate 10. Although the present application is described and illustrated with a single semiconductor channel material pillar 12, the present application can be used in instances in which a plurality of spaced apart semiconductor channel material pillars is formed. In some embodiments, a hard mask cap 14 may be present on top of the semiconductor channel material pillar (or fin) 12.

The semiconductor structure of FIG. 1 further includes a first material stack (16, 18, 20, 22) located adjacent sidewall surfaces of the semiconductor channel material pillar 12 and on the semiconductor substrate 10. The first material stack includes a bottom source/drain layer 16, a bottom spacer layer 18, a first sacrificial gate structure 20 and a first middle spacer layer 22.

The semiconductor structure of FIG. 1 can be formed utilizing conventional techniques well known to those skilled in the art. In one embodiment of the present application, the semiconductor structure of FIG. 1 can be formed by first providing the semiconductor substrate 10. The semiconductor substrate 10 may include at least one semiconductor material having semiconducting properties. Examples of semiconductor materials that may provide at least a portion of the semiconductor substrate 10 may include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment, the semiconductor substrate 10 is a bulk semiconductor substrate. By "bulk" it is meant that the semiconductor substrate 10 is entirely composed of at least one semiconductor material, as defined above. In one example, the semiconductor substrate 10 may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

In another embodiment of the present application, the semiconductor substrate 10 comprises a topmost semiconductor material layer of a semiconductor-on-insulator (SO) substrate. The SOI substrate would also include a handle substrate (not shown) including one of the above mentioned semiconductor materials, and an insulator layer (not shown) such as a buried oxide below the topmost semiconductor material layer.

In any of the above embodiments mentioned above, the semiconductor material that provides the semiconductor substrate 10 may be a single crystalline semiconductor material. The semiconductor material that provides the semiconductor substrate 10 may have any of the well known crystal orientations. For example, the crystal orientation of the base semiconductor substrate 12 may be {100}, {110}, or {111}. Other crystallographic orientations besides those specifically mentioned can also be used in the present application.

After providing the semiconductor substrate 10, the semiconductor channel material pillar 12 is formed. In one embodiment of the present application, the semiconductor channel material pillar 12 can be formed by first providing a sacrificial dielectric material layer (not shown) on the entirety of the semiconductor material surface of the semiconductor substrate 10. In one embodiment, the sacrificial dielectric material layer may include, for example, silicon dioxide. The sacrificial dielectric material layer can be formed utilizing a deposition process such as, for example, chemical vapor deposition (CVD), plasma enhanced chemical vapor deposition, or physical vapor deposition.

Next, an opening is formed into the sacrificial dielectric material layer that exposes a portion of a semiconductor material surface of the semiconductor substrate 10. The opening can be formed utilizing lithography and etching. The opening has a width and height that is used in defining the width and height of the semiconductor channel material pillar 12. In one embodiment, the opening that is formed into the sacrificial dielectric material layer has a width from 6 nm to 12 nm, and a height from 50 nm to 250 nm. The opening can have other widths and heights besides the ranges mentioned herein.

The semiconductor channel material pillar 12 is then epitaxially grown (or deposited) from the exposed portion of the semiconductor material surface of the semiconductor substrate 10. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing the semiconductor channel material pillar 12, the semiconductor channel material pillar 12 has an epitaxial relationship with the exposed semiconductor material surface of the semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 900° C. Although higher temperature typically results in faster deposition, the faster deposition may result in crystal defects and film cracking. The epitaxial growth of the semiconductor channel material pillar 12 can be performed utilizing any well known precursor gas or gas mixture. Carrier gases like hydrogen, nitrogen, helium and argon can be used. Typically, the semiconductor channel material pillar 12 that is epitaxially grown is non-doped.

After forming the semiconductor channel material pillar 12, a recess etch may be performed to recess the height of the originally formed semiconductor channel material pillar 12 and thereafter hard mask cap 14 may be formed on the recessed semiconductor channel material pillar 12. The hard mask cap 14 may be composed of a hard mask material such as, for example, silicon dioxide, silicon nitride or silicon oxynitride; in this embodiment, the hard mask material that provides the hard mask cap 14 is composed of a different dielectric material than the sacrificial dielectric material layer. The hard mask material that provides the hard mask cap 14 may be formed utilizing a deposition process such as, for example, chemical vapor deposition or plasma enhanced chemical vapor deposition. A planarization process may follow the deposition of the hard mask material.

After forming the hard mask capped semiconductor channel material pillar (12, 14), the remaining sacrificial dielectric material layer is removed utilizing an etching process that is selective in removing the dielectric material that provides the sacrificial dielectric material layer.

In another embodiment, the hard mask capped semiconductor channel material pillar (12, 14) may be formed by epitaxially growing a semiconductor material that provides the semiconductor channel material pillar 12 on the entirety of the semiconductor substrate 10, and thereafter forming a hard mask material on the epitaxially grown semiconductor material. The stack of the semiconductor material and the hard mask material can then be patterned to provide the hard mask capped semiconductor channel material pillar (12, 14). Patterning may include, for example, lithography and etching, or a sidewall image transfer process.

The semiconductor channel material pillar 12 may include one of the semiconductor materials mentioned above for the semiconductor substrate 10. In one embodiment, the semiconductor channel material pillar 12 is composed of a same semiconductor material as the semiconductor substrate 10. In another embodiment, the semiconductor channel material pillar 12 is composed of a different semiconductor material than the semiconductor substrate 10. In one embodiment, the semiconductor channel material pillar 12 is composed of a semiconductor material that has a higher electron mobility than the semiconductor material that provides the semiconductor substrate 10. In such an embodiment, the semiconductor channel material pillar 12 may be composed of a III-V compound semiconductor material, while the semiconductor substrate 10 may be composed of silicon.

Next, the first material stack (16, 18, 20, 22) is formed adjacent sidewall surfaces of the semiconductor channel material pillar 12 and on the semiconductor substrate 10. As mentioned above, the first material stack includes bottom source/drain layer 16, bottom spacer layer 18, first sacrificial gate structure 20 and first portion of a middle spacer layer 22.

The bottom source/drain layer 16 includes a semiconductor material and a dopant (stated in other terms the bottom source/drain layer 16 is composed of a first doped semiconductor material). The semiconductor material that provides the bottom source/drain layer 16 may include one of the semiconductor materials mentioned above for the semiconductor substrate 10. In one embodiment, the bottom source/drain layer 16 is composed of a same semiconductor material as the semiconductor substrate 10 and the semiconductor channel material pillar 12. In another embodiment, the bottom source/drain layer 16 is composed of a different semiconductor material than the semiconductor substrate 10 and/or the semiconductor channel material pillar 12. The dopant that is present in the semiconductor material that provides bottom source/drain layer 16 may be a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In one embodiment, the concentration of n-type or p-type dopant within the semiconductor material that provides the bottom source/drain layer 16 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived. In one embodiment, the doping within the bottom source/drain layer 16 may be uniform (i.e., have a uniform distribution of dopants throughout the entire region). In another embodiment, the doping within the bottom source/drain layer 16 may be graded.

The bottom source/drain layer 16 may be formed utilizing an epitaxial growth process as mentioned above. In some instances, an etch back process may follow the epitaxial growth of the bottom source/drain layer 16. In some embodiments, the dopant that is present in the bottom source/drain layer 16 may be introduced in-situ into the precursor gas or gas mixture that provides the bottom source/drain layer 16. In another embodiment, the dopant may be introduced into an intrinsic semiconductor material by ion implantation or gas phase doping.

In one embodiment of the present application, the bottom source/drain layer 16 may have a thickness from 10 nm to 50 nm. Other thicknesses that are lesser than, or greater than, the aforementioned thickness range may also be employed in the present application as the thickness of the bottom source/drain layer 16.

After forming the bottom source/drain layer 16, bottom spacer layer 18 is formed on the physically exposed topmost surface of the bottom source/drain layer 16. The bottom spacer layer 18 may be composed of any dielectric spacer material including for example, silicon dioxide, silicon nitride or silicon oxynitride.

The bottom spacer layer 18 may be formed utilizing a directional deposition process such as, for example, chemical vapor deposition or plasma enhanced chemical vapor deposition. In some instances, an etch back process may follow the deposition of the dielectric spacer material that provides the bottom spacer layer 18. The bottom spacer layer 18 may have a thickness from 4 nm to 10 nm. Other thicknesses that are lesser than, or greater than, the aforementioned thickness range may also be employed in the present application as the thickness of the bottom spacer layer 18.

After forming the bottom spacer layer 18, the first sacrificial gate structure 20 is formed on the physically exposed topmost surface of the bottom spacer layer 18. The first sacrificial gate structure 20 may be formed utilizing a directional deposition process such as, for example, chemical vapor deposition or plasma enhanced chemical vapor deposition. In some instances, an etch back process may follow the deposition of the material that provides the first sacrificial gate structure 20. The first sacrificial gate structure 20 may have a thickness from 10 nm to 30 nm. Other thicknesses that are lesser than, or greater than, the aforementioned thickness range may also be employed in the present application as the thickness of the first sacrificial gate structure 20. The first sacrificial gate structure 20 may be composed of polysilicon, amorphous silicon or any other material that can be used as a placeholder material for a functional gate structure.

Next, the first middle spacer layer 22 is formed on the physically exposed topmost surface of the first sacrificial gate structure 20. The first middle spacer layer 22 may be composed of one of the dielectric spacer materials mentioned above for the bottom spacer layer 18. In one embodiment, the first middle spacer layer 22 is composed of a same dielectric spacer material as the bottom spacer layer 18. For example, the first middle spacer layer 22 and the bottom spacer layer 18 may be composed of silicon nitride. In another embodiment, the first middle spacer layer 22 is composed of a different dielectric spacer material than the bottom spacer layer 18. For example, the first middle spacer layer 22 may be composed of silicon nitride and the bottom spacer layer may be composed of silicon oxynitride.

The first middle spacer layer 22 may be formed utilizing a directional deposition process such as, for example, chemical vapor deposition or plasma enhanced chemical vapor deposition. In some instances, an etch back process may follow the deposition of the dielectric spacer material that provides the first middle spacer layer 22. The first middle spacer layer 22 may have a thickness from 4 nm to 10 nm. Other thicknesses that are lesser than, or greater than, the aforementioned thickness range may also be employed in the present application as the thickness of the first middle spacer layer 22.

Referring now to FIG. 2, there is illustrated the exemplary semiconductor structure of FIG. 1 forming a second material stack (24, 26, 28, 30) adjacent sidewall surfaces of the semiconductor channel material pillar 12 and on the first material stack (16, 18, 20, 22). The second material stack includes, from bottom to top, a sacrificial spacer layer 24, a second middle spacer layer 26, a second sacrificial gate structure 28 and a top spacer layer 30.

Collectively, the first material stack and the second material stack may be referred to herein as merely a material stack. As is shown, the second material stack (and thus the combined first and second material stacks) has a topmost surface that is located beneath a topmost surface of the semiconductor channel material pillar 12 such that upper sidewall surfaces of the semiconductor channel material pillar 12 are physically exposed. It is noted that the material stack including the first and second material stacks laterally surround the semiconductor channel material pillar 12.

The sacrificial spacer layer 24 is formed on the physically exposed topmost surface of the first middle spacer layer 22. The sacrificial spacer layer 24 is composed of a different dielectric spacer material than the first middle spacer layer 22 and, if present, the hard mask cap 14. For example, the first middle spacer layer 22 and, if present, the hard mask cap 14 may be composed of silicon nitride, while the sacrificial spacer layer 24 is composed of silicon dioxide. The sacrificial spacer layer 24 may be formed utilizing a directional deposition process such as, for example, chemical vapor deposition or plasma enhanced chemical vapor deposition. In some instances, an etch back process may follow the deposition of the dielectric spacer material that provides the sacrificial spacer layer 24. The sacrificial spacer layer 24 may have a thickness from 20 nm to 60 nm. Other thicknesses that are lesser than, or greater than, the aforementioned thickness range may also be employed in the present application as the thickness of the sacrificial spacer layer 24.

Next, the second middle spacer layer 26 is formed on the physically exposed topmost surface of the sacrificial spacer layer 24. The second middle spacer layer 26 may be composed a same or different dielectric spacer material than the first middle spacer layer 22 provided that the dielectric spacer materials that provide the first and second middle spacer layers 22, 26 are both different from the dielectric spacer material that provides the sacrificial spacer layer 24. In one example, the first and second middle spacer layers 22, 26 are both composed of a same dielectric spacer material such as, for example, silicon nitride, while the sacrificial spacer layer 24 is composed of silicon dioxide.

The second middle spacer layer 26 may be formed utilizing a directional deposition process such as, for example, chemical vapor deposition or plasma enhanced chemical vapor deposition. In some instances, an etch back process may follow the deposition of the dielectric spacer material that provides the second middle spacer layer 26. The second middle spacer layer 26 may have a thickness from 4 nm to 10 nm. Other thicknesses that are lesser than, or greater than, the aforementioned thickness range may also be employed in the present application as the thickness of the second middle spacer layer 26.

Next, the second sacrificial gate structure 28 is formed on the physically exposed topmost surface of the second middle spacer layer 26. The second sacrificial gate structure 28 may be formed utilizing a directional deposition process such as, for example, chemical vapor deposition or plasma enhanced chemical vapor deposition. In some instances, an etch back process may follow the deposition of the material that provides the second sacrificial gate structure 28. The second sacrificial gate structure 28 may have a thickness from 10 nm to 30 nm. Other thicknesses that are lesser than, or greater than, the aforementioned thickness range may also be employed in the present application as the thickness of the second sacrificial gate structure 28. The second sacrificial gate structure 28 may be composed of polysilicon, amorphous silicon or any other material that can be used as a placeholder material for a functional gate structure. The first and second sacrificial gate structures 20, 28 are typically composed of a same material such that they can be removed together in a single step.

Next, the top spacer layer 30 is formed on the physically exposed topmost surface of the second sacrificial gate structure 28. The top spacer layer 30 may be composed of one of the dielectric spacer materials mentioned above for the bottom spacer layer 18; the top spacer layer 30 must be composed of a different spacer dielectric material than the sacrificial spacer layer 24. In one embodiment, the top spacer layer 30 is composed of a same dielectric spacer material as the bottom spacer layer 18 and optionally the first and second middle spacer layers 22, 26. For example, the top spacer layer 30, the bottom spacer layer 18 and the first and second middle spacer layers 22, 24 may each be composed of silicon nitride.

The top spacer layer 30 may be formed utilizing a directional deposition process such as, for example, chemical vapor deposition or plasma enhanced chemical vapor deposition. In some instances, an etch back process may follow the deposition of the dielectric spacer material that provides the top spacer layer 30. The top spacer layer 30 may have a thickness from 4 nm to 10 nm. Other thicknesses that are lesser than, or greater than, the aforementioned thickness range may also be employed in the present application as the thickness of the top spacer layer 30.

Figure 3:
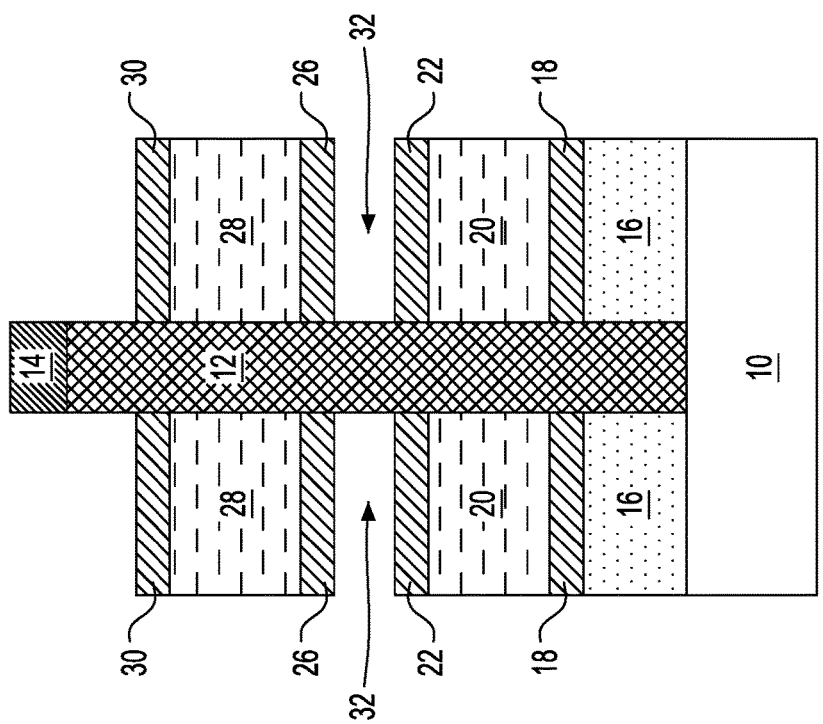
FIG. 3 is a cross sectional view of the exemplary semiconductor structure of FIG. 2 after removing the sacrificial spacer layer located between the first and second middle spacer layers to physically expose sidewall surfaces of a middle portion of the semiconductor channel material pillar.

Referring now to FIG. 3, there is illustrated the exemplary semiconductor structure of FIG. 2 after removing the sacrificial spacer layer 24 located between the first and second middle spacer layers 22, 26 to physically expose sidewall surfaces of a middle portion of the semiconductor channel material pillar 12. The sacrificial spacer layer 24 may be removed utilizing an etching process that is selective in removing the dielectric spacer material of the sacrificial spacer layer 24 relative to the dielectric spacer materials that provide the top spacer layer 30, the first and second middle spacer layers 22, 26 and, if present, the hard mask cap 14. In one embodiment, and when the dielectric spacer material that provides the sacrificial spacer layer 24 is composed of silicon dioxide, and the dielectric spacer material that provides each of the top spacer layer 30, the first and second middle spacer layers 22, 26 and, if present, the hard mask cap 14 is composed of silicon nitride, hydrofluoric acid or a buffered etch (i.e., a mixture of ammonium fluoride and hydrofluoric acid), may be used to remove the sacrificial spacer layer 24. After removing the sacrificial spacer layer 24, a cavity 32 is formed between the first middle spacer layer 22 and the second middle spacer layer 26.

Figure 4:
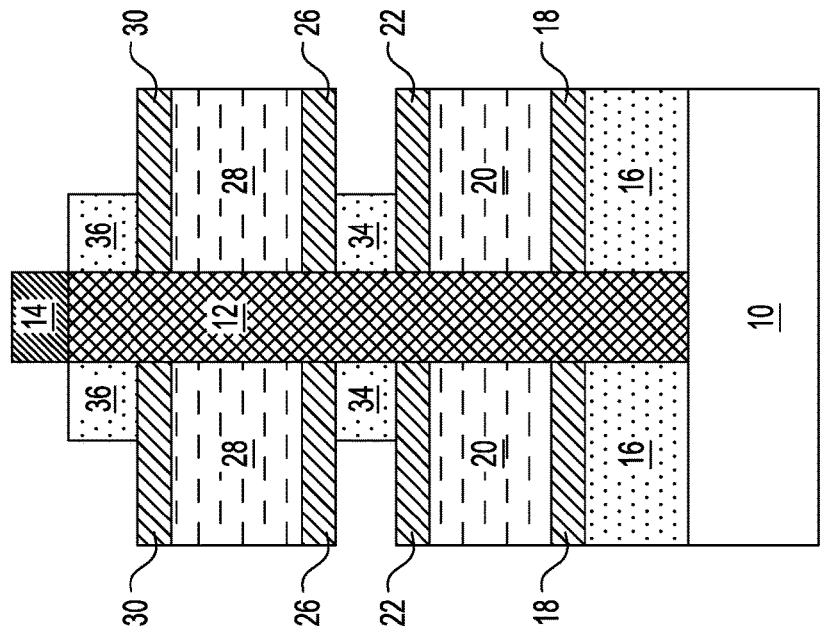
FIG. 4 is a cross sectional view of the exemplary semiconductor structure of FIG. 3 after epitaxially growing a first epitaxial doped semiconductor material layer from exposed sidewall surfaces of the middle portion of the semiconductor channel material pillar, and a second epitaxial doped semiconductor material layer from exposed sidewall surfaces of an upper portion of the semiconductor channel material pillar.

Referring now to FIG. 4, there is illustrated the exemplary semiconductor structure of FIG. 3 after epitaxially growing a first epitaxial doped semiconductor material layer 34 from exposed sidewall surfaces of the middle portion of the semiconductor channel material pillar 12 and within cavity 32, and a second epitaxial doped semiconductor material layer 36 from exposed sidewall surfaces of an upper portion of the semiconductor channel material pillar 12. The first and second epitaxial doped semiconductor material layers 34, 36 are formed simultaneously utilizing an epitaxial growth process as mentioned above.

The first epitaxial doped semiconductor material 34 and the second epitaxial doped semiconductor material 36 comprise a semiconductor material that contains a p-type or n-type dopant. The conductivity type of the dopant (i.e., n or p) is the same as the conductivity type of the dopant present in the bottom source/drain layer 16. The semiconductor material that provides the first epitaxial doped semiconductor material 34 and the second epitaxial doped semiconductor material 36 may be the same as, or different from, the semiconductor material that provides the bottom source/drain layer 16. The concentration of dopant within the semiconductor material that provides the first epitaxial doped semiconductor material 34 and the second epitaxial doped semiconductor material 36 is within the concentration range mentioned above for the bottom source/drain layer 16. The first epitaxial doped semiconductor material 34 has an epitaxial relationship with the middle portion of the semiconductor channel material pillar, while the second epitaxial doped semiconductor material 36 has an epitaxial relationship with the upper portion of the semiconductor channel material pillar. As is shown, the width of the first epitaxial doped semiconductor material 34 and the second epitaxial doped semiconductor material 36 is less than the width of the remaining material layers of the combined first and second material stacks.

Figure 5:
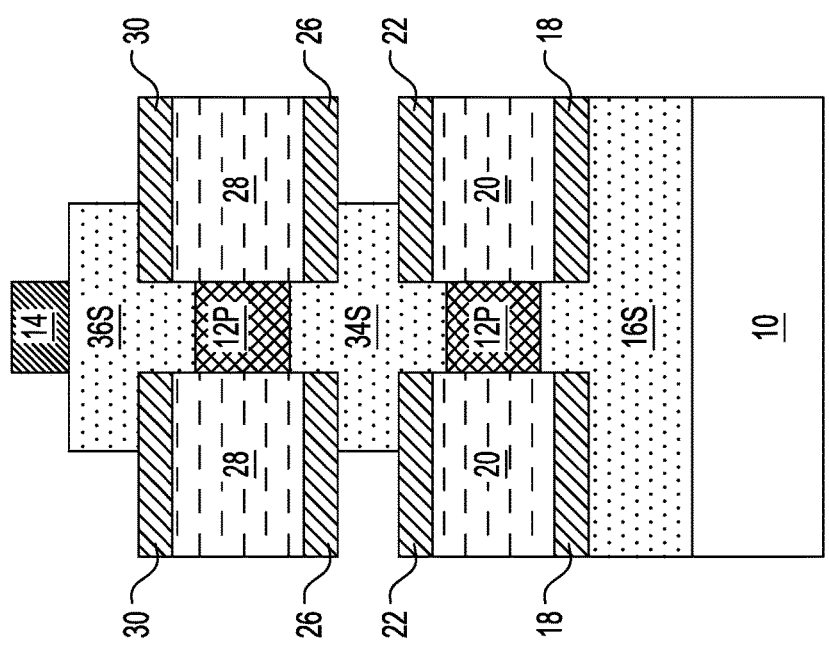
FIG. 5 is a cross sectional view of the exemplary semiconductor structure of FIG. 4 after performing a drive in anneal to provide a bottom source/drain region, a middle source/drain region and a top source/drain region.

Referring now to FIG. 5, there is illustrated the exemplary semiconductor structure of FIG. 4 after performing a drive in anneal to provide a bottom source/drain region 16S, a middle source/drain region 34S and a top source/drain region 36S. Notably, FIG. 5 illustrates the exemplary semiconductor structure of FIG. 4 after an anneal is performed to diffuse dopants from the bottom source/drain layer 18 into a bottom portion of the semiconductor channel material pillar 12 and to provide the bottom source/drain region 16S, dopants from the first epitaxial doped semiconductor material layer 34 into the middle portion of the semiconductor channel material pillar 12 and to provide a middle source/drain region 34S, and dopants from the second epitaxial doped semiconductor material layer 36 into the upper portion of the semiconductor channel material pillar 12 and to provide a top source/drain region 36S.

The anneal (i.e., the drive in anneal) may be performed at a temperature from 700° C. to 1300° C., depending on the annealing time. Typically higher temperatures require less annealing times. Annealing can be done by rapid thermal anneal (RTP), laser anneal, flash anneal, furnace anneal, or any suitable combination of those techniques. In one embodiment, the anneal is done at 1000° C. for 0.5 seconds. Other temperatures may also be used as long as the anneal temperature is capable of forming the bottom source/drain region 16S, the middle source/drain region 34S and the top source/drain region 36S shown in FIG. 5. In some embodiments, the anneal may be performed in an inert ambient such as, for example, helium and/or argon. In other embodiments, the anneal may be performed in a forming gas ambient. The duration of the anneal may vary so long as the duration of the anneal causes dopant diffusion and the formation of the bottom source/drain region 16S, the middle source/drain region 34S and the top source/drain region 36S shown in FIG. 5.

In accordance with the present application, the bottom source/drain region 16S consists of a first doped semiconductor material (i.e., the bottom source/drain layer 16) and a doped lower portion of the semiconductor channel material pillar 12, the middle source/drain region 34S consists of a second doped semiconductor material (i.e., the first epitaxial doped semiconductor material 34) and a doped middle portion of the semiconductor channel material pillar 12, and the top source/drain structure 36S consists of a third doped semiconductor material (i.e., the second epitaxial doped semiconductor material layer 34) and a doped upper portion of the semiconductor channel material pillar 12. Remaining portions of the semiconductor channel material pillar 12 that are not used in forming one of the source/drain regions may be referred to as a channel portion 12P of the semiconductor channel material pillar 12.

In one embodiment, the bottom source/drain region 18S can be used as a source region of a subsequently formed lower functional gate structure, the middle source/drain region 34S can be used a shared drain region of the subsequently formed lower functional gate structure and a subsequently formed upper functional gate structure, and the top source/drain region 36S can be used a source region of the subsequently formed upper functional gate structure.

Figure 6:
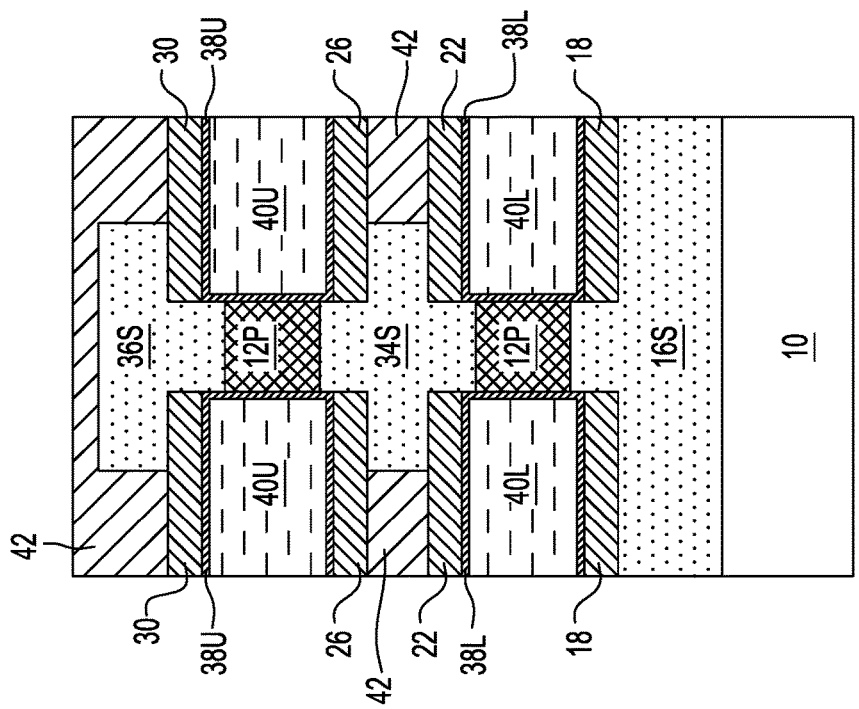
FIG. 6 is a cross sectional view of the exemplary semiconductor structure of FIG. 5 after replacing the first sacrificial gate structure with a lower functional gate structure, and the second sacrificial gate structure with an upper functional gate structure.

Referring now to FIG. 6, there is illustrated the exemplary semiconductor structure of FIG. 5 after replacing the first sacrificial gate structure 20 with a lower functional gate structure 38L, 40L, and the second sacrificial gate structure 28 with an upper functional gate structure (38U, 40U), and forming an interlevel dielectric (ILD) material 42. Typically, the ILD material is formed prior to replacing the first and second functional gate structures 20, 28.

The ILD material 42 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 42. The use of a self-planarizing dielectric material as the ILD material 42 may avoid the need to perform a subsequent planarizing step.

In one embodiment, the ILD material 42 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 42, a planarization process or an etch back process follows the deposition of the dielectric material that provides the ILD material 42.

The first and second sacrificial gate structures 20, 28 are typically removed simultaneously utilizing an etching process that is selective in removing the material that provides the first and second sacrificial gate structures 20, 28. In one embodiment, and when the first and second sacrificial gate structures 20, 28 are composed of polysilicon, ammonia or TMAH (tetramethylammonium hydroxide) can be used as an etchant. In another embodiment, and when the first and second sacrificial gate structures 20, 28 are composed of amorphous silicon, ammonia or TMAH can be used as an etchant.

The removal of the first sacrificial gate structure 20 provides a lower gate cavity (not shown) that exposes sidewall surfaces of the channel portion 12P that is located between the bottom source/drain region 18S and the middle source/drain region 34S and between the bottom spacer layer 18 and the first middle spacer layer 22, while the removal of the second sacrificial gate structure 28 exposes sidewall surfaces of the channel portion 12P that is located between the middle source/drain region 34S and the top source/drain region 36S and between the second middle spacer layer 26 and the top spacer layer 30.

Each gate cavity is then filled with a gate dielectric portion (38L, 38U) and a gate conductor portion (40L, 40U). Each gate dielectric portion (38L, 38U) may be composed of a gate dielectric material such as, for example, an oxide, nitride, and/or oxynitride. In one example, the gate dielectric portion (38L, 38U) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion (38L, 38U). The gate dielectric material that provides the gate dielectric portion (38L, 38U) can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material that provides the gate dielectric portion (38L, 38U) can have a thickness in a range from 1 nm to 10 nm. Other thicknesses that are lesser than, or greater than, the aforementioned thickness range can also be employed for the gate dielectric material that provides gate dielectric portion (38L, 38U).

Each gate conductor portion (40L, 40U) includes a gate conductor material. The gate conductor material used in providing the gate conductor portion (40L, 40U) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor material may comprise an nFET gate metal. In another embodiment, the gate conductor material may comprise a pFET gate metal. The gate conductor material used in providing the gate conductor portion (40L, 40U) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor portion (40L, 40U) can have a thickness from 50 nm to 200 nm. Other thicknesses that are lesser than, or greater than, the aforementioned thickness range can also be employed for the gate conductor portion (40L, 40U).

As is shown in FIG. 6, each gate dielectric portion (38L, 38U) has a first portion that directly contacts a channel portion 12P of the semiconductor channel material pillar 12, a second portion that directly contacts a topmost surface of the gate electrode portion (40L, 40U), and a third portion that directly contacts a bottommost surface of the gate electrode portion (40L, 40U).

Referring again to FIG. 6, there is shown the semiconductor structure of the present application. Notably, the semiconductor structure includes a lower functional gate structure (38L, 40L) located adjacent sidewall surfaces of a lower channel portion 12P of a semiconductor channel material pillar 12. An upper functional gate structure (38U, 40U) is located above the lower functional gate structure (38L, 40L) and adjacent sidewall surfaces of an upper channel portion 12P of the semiconductor channel material pillar 12. A bottom source/drain region 16S is located beneath the lower functional gate structure (38L, 40L), a middle source/drain region 34S is located between the lower functional gate structure (38L, 40L) and the upper functional gate structure (38U, 40U), and a top source/drain region 36S is located above the upper functional gate structure (38U, 40U).

The semiconductor structure of FIG. 6 also includes the bottom spacer layer 18 located between the lower functional gate structure (38L, 40L) and the bottom source/drain region 16S, the first middle spacer layer 22 located between the lower functional gate structure (38L, 40L) and the middle source/drain region 34S, and a second middle spacer layer 26 located between the middle source/drain region 34S and the upper functional gate structure (38U, 40U), and the top spacer layer 30 located between the upper functional gate structure (38U, 40U) and the top source/drain region 36S. As is further shown, lower functional gate structure (38L, 40L) and upper functional gate structure (38U, 40U), which are vertically stacked, surround channel portions 12P of the semiconductor channel material pillar 12.

Figure 7:
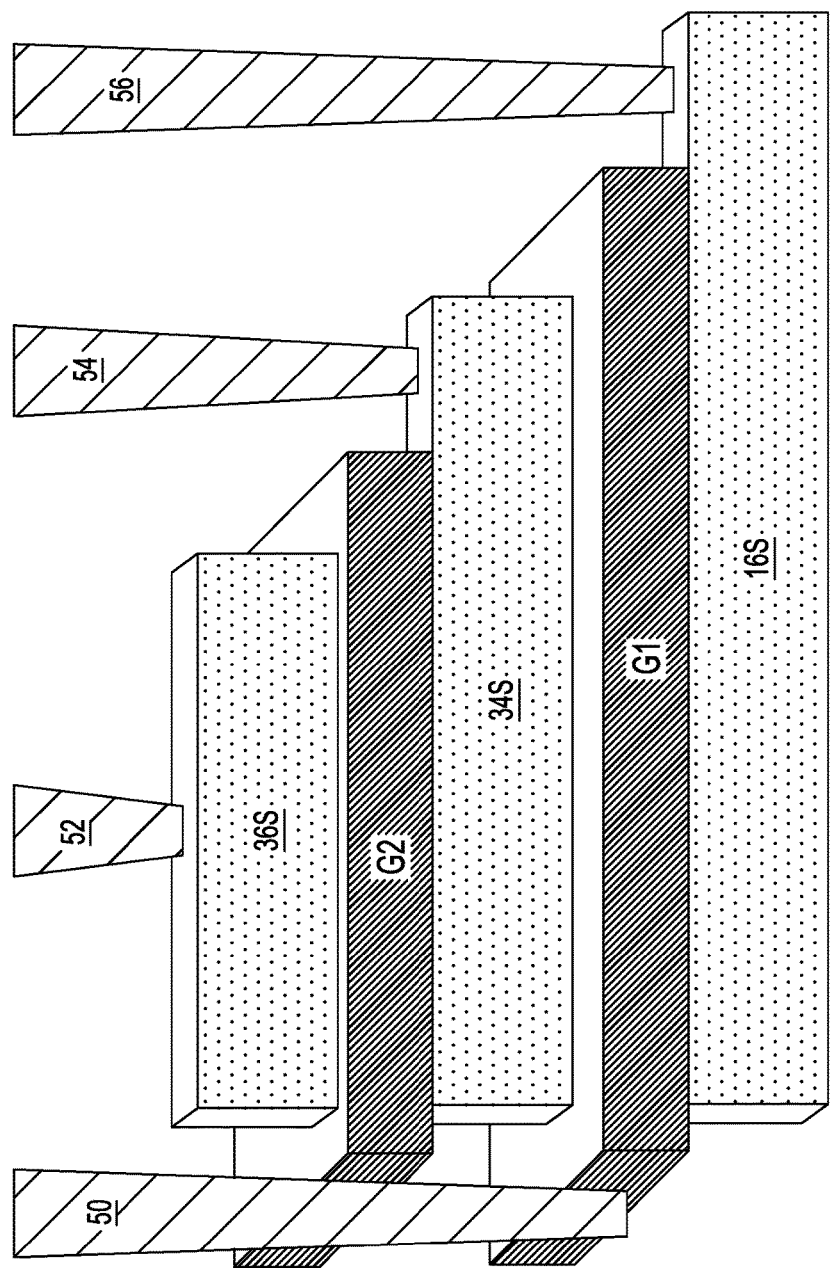
FIG. 7 is a pictorial representation of the exemplary semiconductor structure of the present application after forming various contact structures.

Referring now to FIG. 7, there is illustrated the exemplary semiconductor structure of the present application after forming various contact structures; the ILD material is not shown for clarity. Notably, FIG. 7 illustrates the exemplary semiconductor structure of the present application after forming a gate contact structure 50 contacting both the upper functional gate structure (G2=38U,40U) and lower functional gate structure (G1=38L,40L), a first source/drain contact structure 52 contacting the top source/drain region 36S, a second source/drain contact structure 54 containing the middle source/drain region 34S, and a third source/drain contact structure 56 contacting the bottom source/drain region 16S. Each contact structure may be formed by conventional means well known to those skilled in the art. Each contact structure may be composed of a contact metal such as, for example, copper, tungsten or a copper-tungsten alloy.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a lower functional gate structure located adjacent sidewall surfaces of a lower channel portion of a semiconductor channel material pillar;
an upper functional gate structure located above the lower functional gate structure and adjacent sidewall surfaces of an upper channel portion of the semiconductor channel material pillar;
a bottom source/drain region located beneath the lower functional gate structure;
a middle source/drain region located between the lower functional gate structure and the upper functional gate structure;
a first middle spacer layer located between the lower functional gate structure and the middle source/drain region, and a second middle spacer layer located between the middle source/drain region and the upper functional gate structure; and
a top source/drain region located above the upper functional gate structure, wherein the middle source/drain region contacts a vertical sidewall of both the first and second middle spacer layers and extends partially between the first and second middle spacers layers.

2. The semiconductor structure of claim 1, further comprising a bottom spacer layer located between the lower functional gate structure and the bottom source/drain region.

3. The semiconductor structure of claim 2, further comprising a top spacer layer located between the upper functional gate structure and the top source/drain region.

4. The semiconductor structure of claim 1, wherein the bottom source/drain region is a source region of the lower functional gate structure, the middle source/drain region is a shared drain region of the lower functional gate structure and the upper functional gate structure, and the top source/drain region is a source region of the upper functional gate structure.

5. The semiconductor structure of claim 1, wherein the top source/drain region, the middle source/drain region and the bottom source/drain region have an epitaxial relationship with the semiconductor channel material pillar.

6. The semiconductor structure of claim 1, further comprising an interlevel dielectric material located on exposed surfaces of the top source/drain region and the middle source/drain region.

7. The semiconductor structure of claim 1, wherein the lower functional gate structure and the upper functional gate structure each comprises a gate dielectric portion and a gate electrode portion.

8. The semiconductor structure of claim 7, wherein each gate dielectric portion has a first portion that directly contacts a channel portion of the semiconductor channel material pillar, a second portion that directly contacts a topmost surface of the gate electrode portion, and a third portion that directly contacts a bottommost surface of the gate electrode portion.

9. The semiconductor structure of claim 1, further comprising a gate contact structure contacting both the upper and lower functional gate structures, a first source/drain contact structure contacting the top source/drain region, a second source/drain contact structure containing the middle source/drain region, and a third source/drain contact structure contacting the bottom source/drain region.

10. The semiconductor structure of claim 1, wherein the semiconductor channel material pillar extends upward from a semiconductor material surface of a semiconductor substrate.

11. The semiconductor structure of claim 1, wherein the bottom source/drain region consists of a first doped semiconductor material and a doped lower portion of the semiconductor channel material pillar, the middle source/drain region consists of a second doped semiconductor material and a doped middle portion of the semiconductor channel material pillar, and the top source/drain structure consists of a third doped semiconductor material and a doped upper portion of the semiconductor channel material pillar.

* * * * *